United States Patent [19]
Doerr

[11] Patent Number: 5,764,665
[45] Date of Patent: Jun. 9, 1998

[54] DIRECT MODULATION OF LONG-CAVITY SEMICONDUCTOR LASERS

[75] Inventor: Christopher Richard Doerr, Atlantic Highlands, N.J.

[73] Assignee: Lucent Technologies Inc., Murray Hill, N.J.

[21] Appl. No.: 756,735

[22] Filed: Nov. 26, 1996

[51] Int. Cl.$^6$ .................................................. H01S 3/10
[52] U.S. Cl. ........................... 372/26; 372/28; 372/92
[58] Field of Search .............................. 372/9, 26–29, 372/32, 33, 92

[56] References Cited

U.S. PATENT DOCUMENTS

| | | | |
|---|---|---|---|
| 4,209,689 | 6/1980 | Linford et al. | 372/26 X |
| 5,243,613 | 9/1993 | Gysel et al. | 372/26 |

OTHER PUBLICATIONS

"A Linearized Theory for the Diode Laser in an External Cavity", L. A. Glasser; IEEE Journal of Quantum Electronics. vol. QE–16, No. 5, May 1980; pp. 525–531.

"Small–Signal Analysis of Semiconductor Lasers Modulated at Frequencies on the Order of the Beat Frequency", S. R. A. Dods et al; IEEE Journal of Quantum Electronics. vol. 29, No. 10, Oct. 1993; pp. 2631–2638.

Primary Examiner—John D. Lee

[57] ABSTRACT

The modulation bandwidth of a long-cavity semiconductor laser and a multi-frequency long-cavity semiconductor laser is increased by electronic precompensation of the modulation input. The modulation bandwidth may be further increased by having the modulated amplifier and the desired output as far apart as possible.

17 Claims, 11 Drawing Sheets

1.05694 us ⟶　　　　200 ps/div

FIG. 5B 1.05694 us ⟶　　　　200 ps/div

TABLE 1 (PAGE 1 OF 2)

| SYMBOL | VALUE | DESCRIPTION |
|---|---|---|
| $A$ | $hw$ | OPTICAL MODE CROSS-SECTIONAL AREA |
| $\alpha$ | 9 | LINEWIDTH ENHANCEMENT PARAMETER |
| $\beta$ | | PROPAGATION CONSTANT |
| $\beta_0$ | $\beta(\omega_0)$ | PROPAGATION CONSTANT AT $\omega = \omega_0$ |
| $\beta_0^i$ | SEE EQ. (3) | IMAG. PART OF $\beta_0$ TAKEN IN TIME DOMAIN |
| $\beta_0^r$ | $1.32 \times 10^7$ m$^{-1}$ | REAL PART OF $\beta_0$ TAKEN IN TIME DOMAIN |
| $\beta_1$ | $d\beta/d\omega\|_{\omega=\omega_0} = 1.20 \times 10^{-8}$ s/m | 1ST DERIVATIVE OF PROPAGATION CONSTANT |
| $\beta_2$ | $d^2\beta/d\omega^2\|_{\omega=\omega_0} = 2.40 \times 10^{-24}$ s$^2$/m | 2ND DERIVATIVE OF PROPAGATION CONSTANT |
| $C_c$ | | CAPACITANCE IN COMPENSATION CIRCUIT |
| $d_1$ | $l_1/2$ | DISTANCE OF AMPLIFIER 1 FROM ADJ. MIRROR |
| $d_2$ | $l_2/2$ | DISTANCE OF AMPLIFIER 2 FROM ADJ. MIRROR |
| $D$ | | ELECTRIC FLUX DENSITY |
| $e$ | $1.6 \times 10^{-19}$ C | CHARGE OF AN ELECTRON |
| $\varepsilon$ | $2.1 \times 10^{-23}$ m$^3$ | PHOTON DENSITY GAIN NONLINEARITY COEFF. |
| $\varepsilon_p$ | $\varepsilon_p^r + j\varepsilon_p^i$ | POWER GAIN NONLINEARITY COEFF. |
| $\varepsilon_p^i$ | $-4\pi n_2 v_g^2/[\Gamma g_0^2(N_0-N_t)\lambda\tau_n] \cong 0.018$ | IMAG. PART OF POWER GAIN NONLIN. COEFF. |
| $\varepsilon_p^r$ | $\varepsilon/(g_0\tau_n) = 0.044$ | REAL PART OF POWER GAIN NONLIN. COEFF. |
| $E$ | | ELECTRIC FIELD STRENGTH |
| $F$ | $1/[j\Omega\tau_n+(\gamma P_0+P_{sat})/P_{sat}]$ | CARRIER DENSITY RESPONSE |
| $g_0$ | $1.6 \times 10^{-12}$ m$^3$/s | TEMPORAL GAIN CONSTANT |
| $G$ | $2\beta_0^i l_a$ | EXP($G$) IS THE POWER GAIN OF THE AMP. |
| $Y_k$ | $[1+r_k^2\exp(G_k)]r_2/r_k$ | RATIO OF POWERS EXITING AMPLIFIER $k$ TO $p_0$ |
| $\Gamma$ | $\sim h_a/h$ | MODE CONFINEMENT FACTOR |
| $h$ | 0.6 $\mu$m | HEIGHT OF OPTICAL MODE |
| $h_a$ | 0.04 $\mu$m | HEIGHT OF ACTIVE SECTION |
| $\hbar$ | $1.05 \times 10^{-34}$ J s | PLANCK'S CONSTANT |
| $\eta$ | | INTRINSIC IMPEDANCE |
| $H$ | $1/(j\Omega\tau_{para}+1)$ | RESPONSE DUE TO PARASITICS |
| $i$ | | DRIVE CURRENT |
| $I$ | | STEADY-STATE DRIVE CURRENT |
| $I_1$ | 65 mA | STEADY-STATE DRIVE CURRENT TO AMPLIFIER 1 |
| $I_2$ | 65 mA | STEAD-STATE DRIVE CURRENT TO AMPLIFIER 2 |
| $j$ | $\sqrt{-1}$ | IMAGINARY NUMBER |

FIG. 8B

TABLE 1 (PAGE 2 OF 2)

| SYMBOL | VALUE | DESCRIPTION |
|---|---|---|
| $l_1$ | 0.8 mm | LENGTH OF AMPLIFIER 1 |
| $l_2$ | 0.8 mm | LENGTH OF AMPLIFIER 2 |
| $l_a$ | | LENGTH OF AMPLIFIER |
| $l_c$ | $v_g/(1.76 \times 10^9 \text{ Hz})/2 = 2.33$ cm | LENGTH OF CAVITY |
| $\lambda$ | 1.55 μm | FREE-SPACE WAVELENGTH |
| $m$ | | AMPLITUDE MODULATION INDEX |
| $\mu_0$ | | PERMEABILITY OF FREE-SPACE |
| $n$ | | CARRIER DENSITY |
| $n_2$ | $-2 \times 10^{-12}$ cm²/W | INDEX NONLINEARITY COEFFICIENT |
| $N$ | | STEADY-STATE CARRIER DENSITY |
| $N_t$ | $1.0 \times 10^{18}$ cm³ | TRANSPARENCY CARRIER DENSITY |
| $p$ | | OPTICAL POWER |
| $p_a$ | | OPTICAL POWER PASSING THROUGH AMPLIFIER |
| $P$ | | STEADY-STATE OPTICAL POWER |
| $P_0$ | 1.5 mW | STEADY-STATE $p_0$ |
| $P_{sat}$ | $Av_g\hbar\omega_0/(g_0\tau_n) = 15.9$ mW | OPTICAL SATURATION POWER |
| $r_1$ | 1.0 | AMPLITUDE REFLECTIVITY OF MIRROR 1 |
| $r_2$ | $\sqrt{0.7}$ | AMPLITUDE REFLECTIVITY OF MIRROR 2 |
| $R_c$ | | RESISTANCE IN COMPENSATION CIRCUIT |
| $R_t$ | 50 Ω | IMPEDANCE OF TRANSMISSION LINE |
| $t$ | | TIME |
| $\tau_n$ | 300 ps | SPONTANEOUS EMISSION TIME |
| $\tau_{para1}$ | 150 ps | TIME CONSTANT OF AMPLIFIER 1 PARASITICS |
| $\tau_{para2}$ | 0.0 s | TIME CONSTANT OF AMPLIFIER 2 PARASITICS |
| $u$ | | OPTICAL FIELD AMPLITUDE |
| $U$ | | STEADY-STATE OPTICAL FIELD AMPLITUDE |
| $v$ | $h_a w l_a$ | TOTAL ACTIVE SECTION VOLUME |
| $v_g$ | $1/\beta_1 = 8.31 \times 10^7$ m/s | GROUP VELOCITY IN CAVITY |
| $w$ | 1.2 μm | WIDTH OF OPTICAL MODE |
| $\omega$ | | OPTICAL FREQUENCY |
| $\omega_0$ | $2\pi(3 \times 10^8 \text{ m/s})/\lambda$ | CARRIER FREQUENCY |
| $\Omega$ | $\omega - \omega_0$ | MODULATION FREQUENCY |
| $z$ | | PROGAGATION DISTANCE |

DIRECT MODULATION OF LONG-CAVITY SEMICONDUCTOR LASERS

TECHNICAL FILED OF THE INVENTION

This invention relates to long-cavity semiconductor lasers used as multifrequency optical sources and, more particularly, to the direct modulation of such long-cavity semiconductor lasers.

BACKGROUND OF THE INVENTION

Directly modulating the drive current of a semiconductor laser is a simple and cost-effective way to modulate the laser output. The direct modulation of short-cavity semiconductor lasers (round-trip time much shorter than the spontaneous emission time, i.e., cavity length $<<\sim 1$ cm), such as distributed feedback (DFB) lasers, is well understood. For example, see the articles, "ModeControlled Semiconductor Lasers," *Guided-Wave Optoelectronics*, New York: Springer-Verlag, 1990, by I. P. Kaminow and R. S. Tucker (Ref. [1]) and "Laser Diode Modulation and Noise," Massachusetts: Kluwer Academic Publishers, 1991, by K. Petermann.

However, the direct modulation of long-cavity semiconductor lasers is different, because, unlike with short-cavity semiconductor lasers, the desired modulation frequency can easily approach the cavity round-trip frequency. In 1980, L. A. Glasser, in his article "A Linearized theory for the diode laser in an external cavity," *IEEE J. of Quant. Electron.*, vol. QE-16, pp. 525–531, 1980, studied the small-signal intensity modulation response for such a case. Others including S. R. A. Dods et al in the article "Small-signal analysis of semiconductor lasers modulated at frequencies on the order of the beat frequency," IEEE J. Quant. Electron., vol. 29, pp. 2631–2638, 1993 have also studied the small-signal intensity modulation response at frequencies exceeding the cavity round-trip frequency. However, they apply their analysis mainly to short-cavity lasers, and they neglect fast nonlinearities. Also, many authors have studied the direct modulation of long compound cavity lasers, including K. Ebeling et al in "Analysis of multielement semiconductor lasers," *J. Appl. Phys.*, vol. 54, pp. 2962–2969, 1983 and G. P. Agrawal in "Generalized rate equations and modulation characteristics of external-cavity semiconductor lasers," *J. Appl. Phys.*, vol. 56, pp. 3110–3115, 1984. However, these analyses focus on the interactions between multiple cavities.

As a result of these prior efforts, long-cavity semiconductor laser have not been successfully used as a multifrequency optical source to produce several intensity-modulated signals at different frequencies.

SUMMARY OF THE INVENTION

I have recognized that some of the prior art models used to simulate long-cavity semiconductor laser are not completely accurate, that the effect of fast nonlinearities should not be neglected, and that by concentrating on single-cavity lasers (no intracavity reflections) the modulation bandwidth of a long-cavity semiconductor laser can be increased. More particularly, in accordance with the present invention, the modulation bandwidth of a long-cavity semiconductor laser and a multi-frequency long-cavity semiconductor laser is increased by electronic precompensation of the modulation input. The modulation bandwidth may be further increased by having the modulated amplifier and the desired output as far apart as possible.

BRIEF DESCRIPTION OF THE DRAWING

In the drawings:

FIG. 3 shows the theoretical (solid) and measured (dashed) plots of $|\Delta\tilde{p}_0/\Delta\tilde{i}_1|$ (FIG. 3a) and $|\Delta\tilde{p}_0/\Delta\tilde{i}_2|$ (FIG. 3b) vs. modulation frequency $\Omega$;

FIG. 5 shows an eye diagram from directly modulating a channel in the 24-channel MFL with 1.24 Gb/s pseudo-random data (FIG. 5a) is without any electronic compensation, and (FIG. 5b) is with the electrical compensation in accordance with the present invention (the complementary outputs from a pattern generator were combined in a power combiner and sent to amplifier 1 with one of the outputs delayed by 370 ps and attenuated by 4 dB with respect to the other);

GENERAL DESCRIPTION

I have recognized that the application of a high-speed modulation signal via the drive current to a long-cavity semiconductor laser (cavity length $>\sim 1$ cm) differs from the short-cavity case in that the variation of the optical field within one round-trip time is not negligible. Such a long-cavity semiconductor laser may have an optical cavity containing one or more optical gain elements (e.g., optical amplifiers) for which the round-trip frequency of a lightwave in the cavity is on the order of or lower than the inverse of the response tome of the gain elements. The modulation response for a semiconductor laser of arbitrary length has been determined and related to results obtained on the multi-frequency waveguide grating router laser, a long-cavity laser. I have found that the largest modulation bandwidth is achieved by having the modulated amplifier and the desired output as far apart as possible. Moreover, the modulation bandwidth can be further increased by simple electronic precompensation. Furthermore, because of fast non-linearities the broadband intensity modulation of long-cavity lasers exhibits substantially less chirp than short-cavity lasers, the chirp essentially equal to that of the amplifiers. A small signal model for the modulation of semiconductor lasers is derived in my article entitled "Direct Modulation of Long-Cavity Semiconductor Lasers," Journal of Lightwave Technology, Vol. 14, No. 9., September 1996, which is incorporated by reference herein.

Using my small signal model for the modulation of semiconductor lasers of arbitrary length with multiple optical amplifiers, it is possible to discuss the optical power modulation response, spectral characteristics, amplitude-phase coupling, and simultaneous modulation of multiple channels in a multi-frequency long-cavity semiconductor laser ( e.g., a multi-frequency waveguide grating router laser (MFL)).

DETAILED DESCRIPTION

The conventional derivation for the modulation of semiconductor lasers assumes that the optical field varies slowly with respect to the cavity round-trip time. However, for long-cavity lasers I have taken a different approach. In my aboveidentified article there are presented equations that describe the optical field in a cavity with semiconductor gain. Because the equations are nonlinear, I have made a small-signal approximation, thereby linearizing the equations. The resulting model was used to determine modulation response and amplitude phase-coupling of semiconductor lasers.

Figure 1:
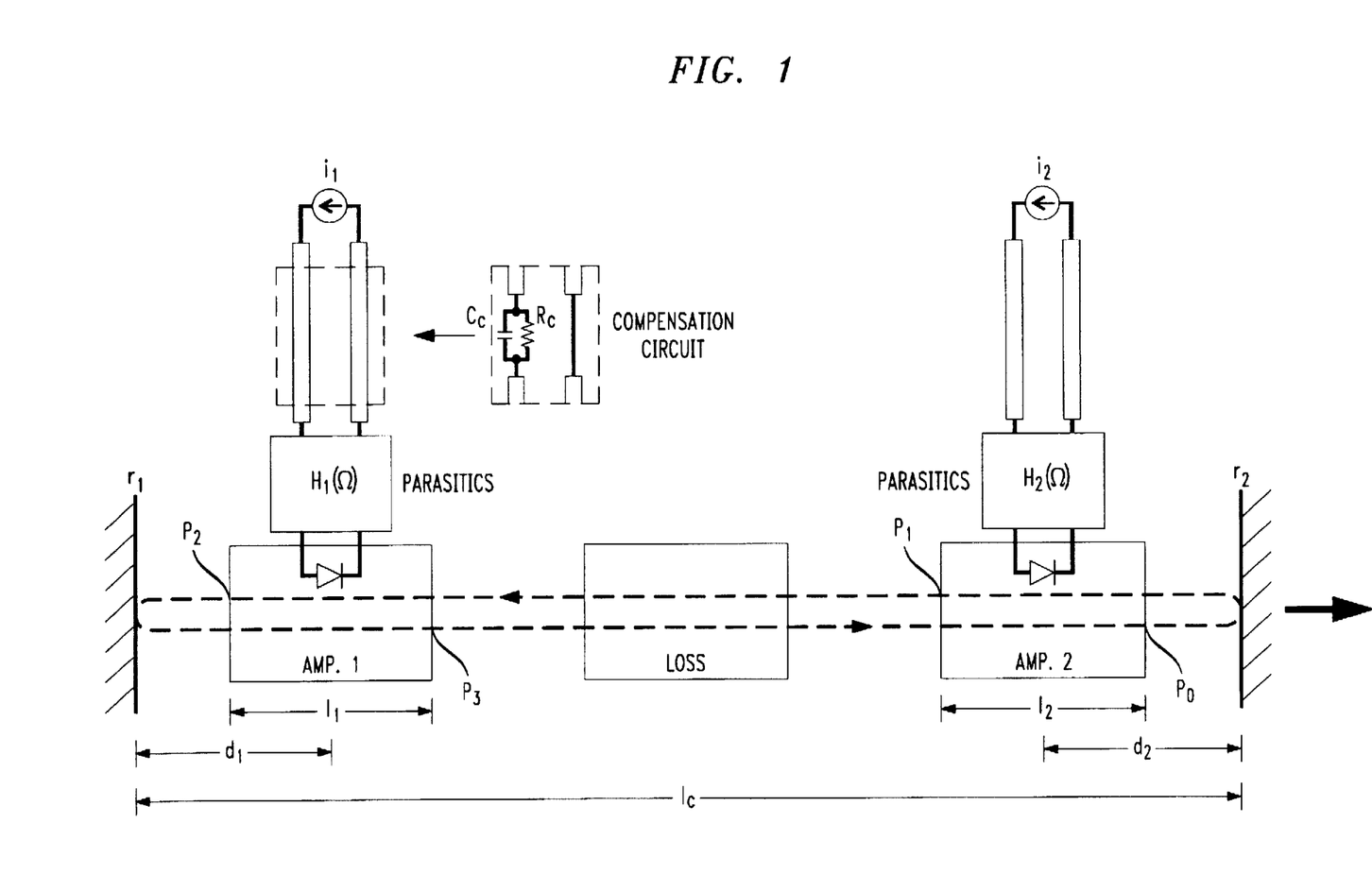
FIG. 1 shows an illustrative Fabry-Perot laser adapted in accordance with the present invention.

With reference to FIG. 1 there is shown a Fabry-Perot laser having two semiconductor amplifiers 1 and 2 and a precompensation circuit. The Fabry-Perot laser of FIG. 1 may be an individual channel of a multi-frequency waveguide grating router laser (MFL). Thus, with reference to the MFL shown in FIG. 7a, the amplifiers 1 and 2 of the Fabry-Perot laser of FIG. 1 may be amplifiers 701 and 710, respectively. In such an arrangement, the Fabry-Perot laser of FIG. 1 is an individual channel of the MFL of FIG. 7a, in which amplifier 1 is an array amplifier 701 and amplifier 2 is the shared amplifier 710.

Figure 7A:
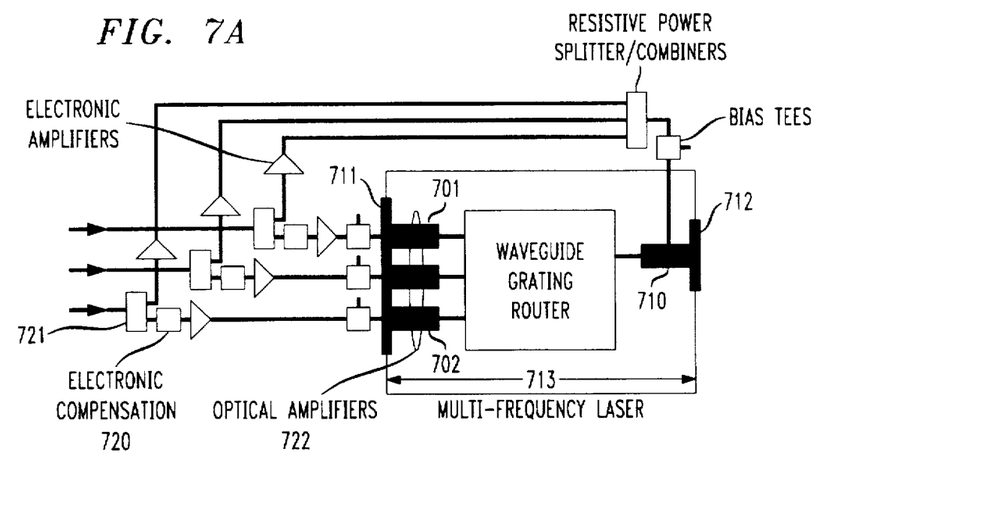
FIG. 7a shows a feed forward apparatus and FIG. 7b shows measured data of bit error rate vs. received optical power for the direct modulation of channels of the MFL with 1.24 Gb/s $2^{23}-1$ pseudorandom NRZ data. The diamonds, triangles, and squares are for the case of three channels modulated simultaneously with uncorrelated data, and the circles are for one channel alone. Hollow and solid symbols represent without and with feed forward to the output amplifier, respectively. The measured optical spectrum during modulation is shown inside FIG. 7b.

Such an MFL is described in the article by M. Zirngibl, et al "Characterization of multiwavelength waveguide grating router laser," *IEEE Photon. Technol, Lett.*, vol. 6, pp. 1082–1084, 1994. The MFL consists of a set of semiconductor amplifiers 701–702 connected to the ports of one side of a waveguide grating router 703 and one amplifier 710 connected to one port of the other side of waveguide grating router 703. Both sides of the structure are terminated with mirrors 711 and 712, respectively. A high performance, large channel number MFL has an especially long cavity 713.

The Fabry-Perot laser of FIG. 1 and the MFL of FIG. 7 may then both be considered as examples of a long-cavity semiconductor laser.

Optical power modulation response

It is desired to know the response of the optical power exiting the laser to changes in the drive currents to the amplifiers.

A. Simplified model

Figure 8A:
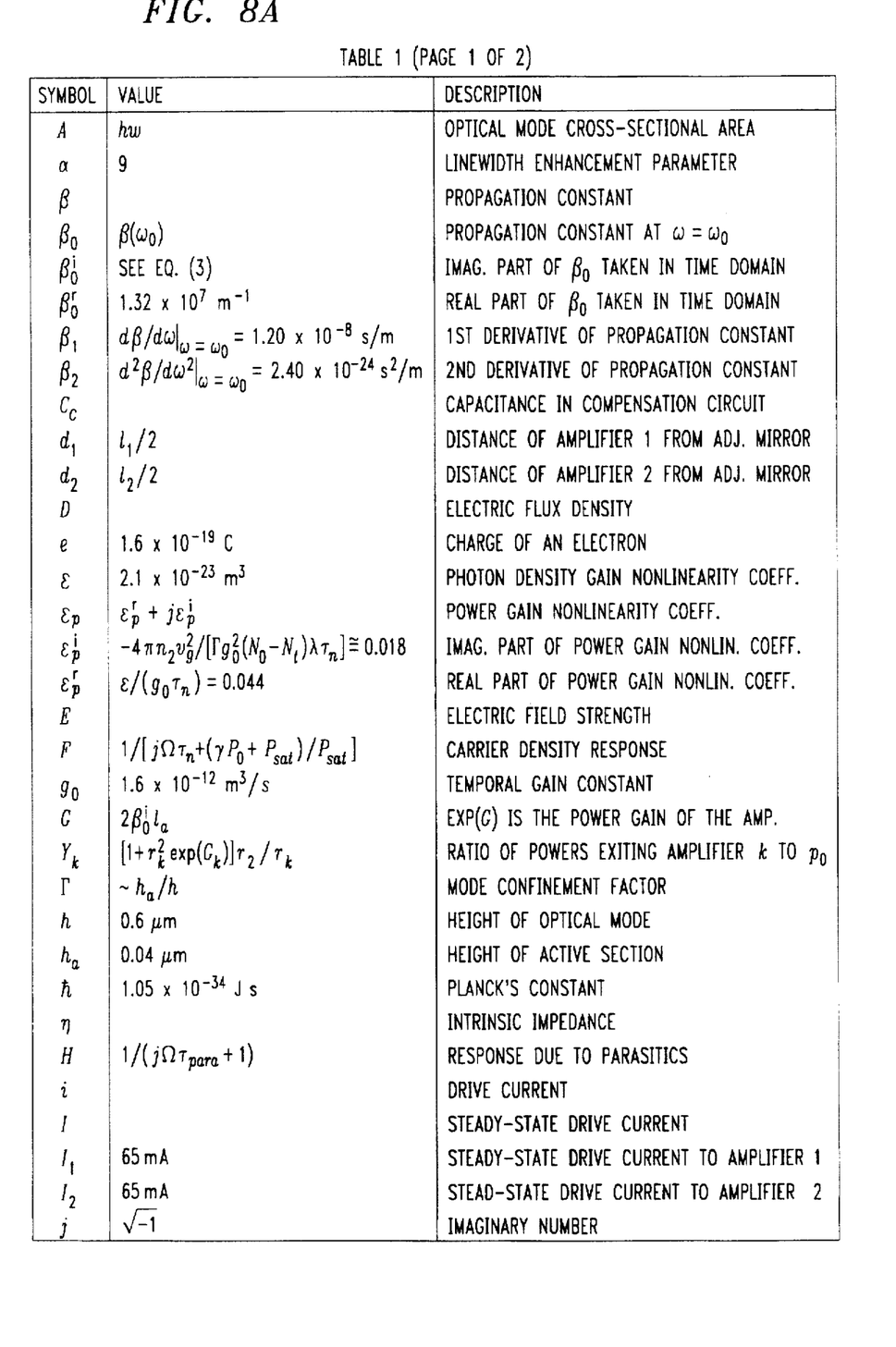
FIGS. 8a and 8b are two pages of table 1 that defines the variables (and estimated parameters for an operating condition of an 24-channel MFL) which are used in the following description.
Figure 8B:
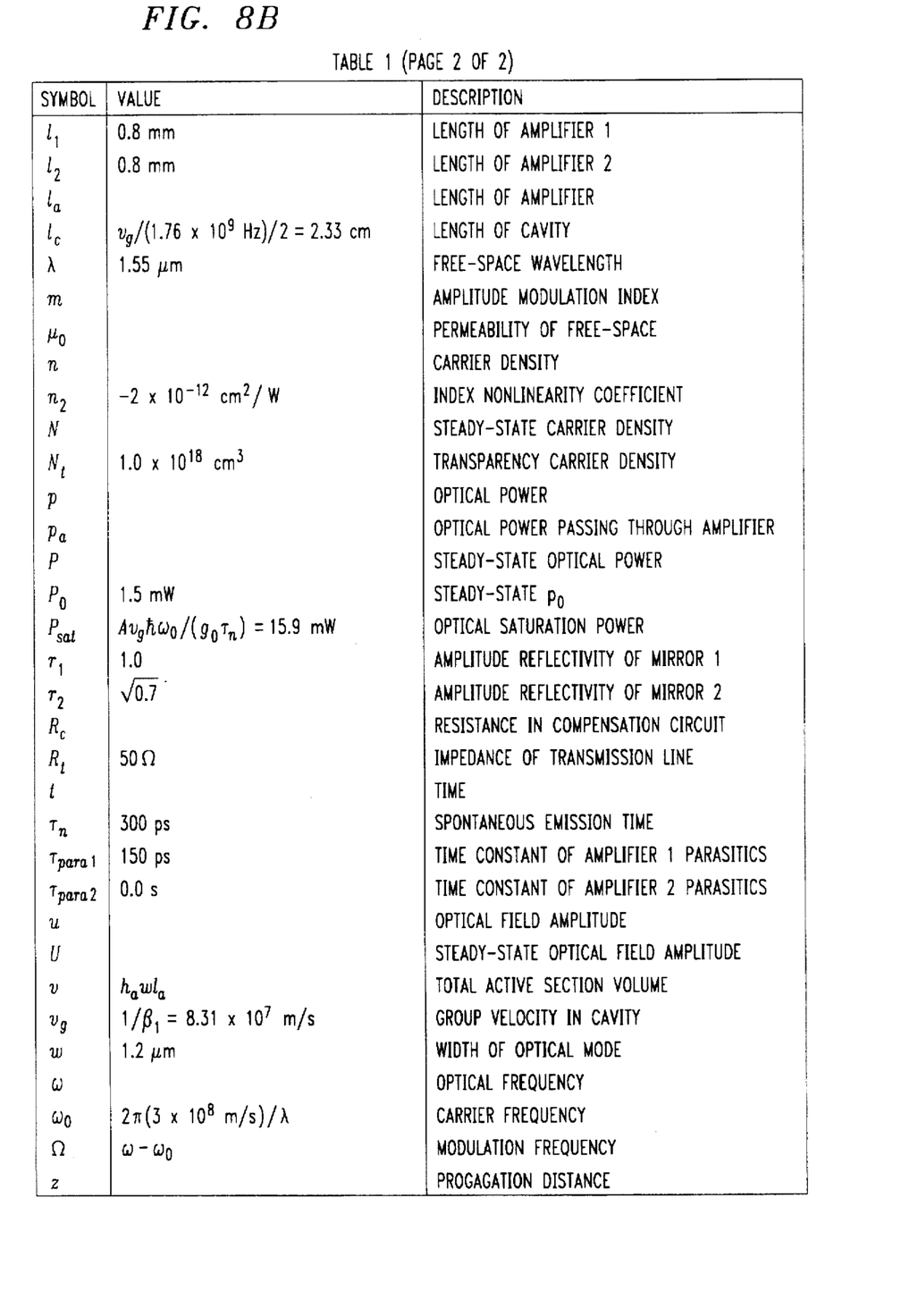

The table shown in FIG. 8 defines the variables (and estimated parameters for an operating condition of an 24-channel MFL) which are used in the following description.

Figure 2:
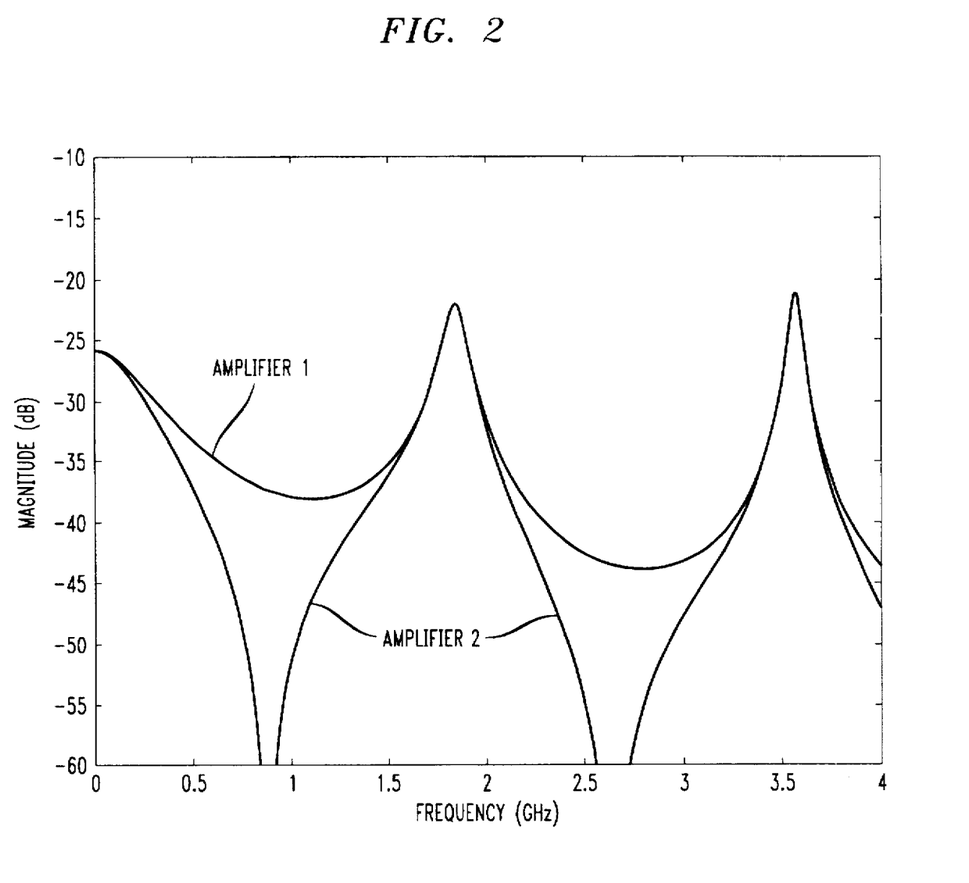
FIG. 2 shows theoretical plots of $|\Delta\tilde{p}_0/\Delta\tilde{i}_1|$ and $|\Delta\tilde{p}_0/\Delta\tilde{i}_2|$ vs. modulation frequency $\Omega$ for the simplified intensity response function, Eq. (2)

In order to get a qualitative understanding of the response, we first calculate a simpler case of the laser in FIG. 1. For this case, we make the constraints that $r_1=r_2$, $d_1=d_2=0$, both amplifiers 1 and 2 are the same and are driven with the same bias current $I_0$, and $G_k P/P_{sat} \ll 1$, where $P \exp(G_k)$ is the power gain of amplifier k. This last constraint holds, for example, if the laser is just above threshold. Under these constraints, one can ignore the influence of the small-signal gain compression of one amplifier on the other amplifier. Thus it can be shown [Eq. (13) of my above-referenced article] that one can write the modulation response for $P_0$, where $p_0$ is as shown in FIG. 1:

$$\Delta \tilde{p}_0 = \exp(-j\Omega 2l_c/v_g)\Delta \tilde{p}_0 + 2P_0\{\Delta \beta_1 \tilde{'} 2l_1 \exp(-j\Omega l_c/v_g) + \Delta \beta_2 \tilde{l}_2[1+\exp(-j\Omega 2l_c/v_g)]\} \quad (1)$$

and that $$\frac{\Delta \tilde{p}_0}{P_0} = \frac{\hbar \omega_0 F}{2eP_{sat}} \frac{2H_1 \Delta \tilde{i}_1 \exp(-j\Omega l_c/v_g) + H_2 \Delta \tilde{i}_2[1+\exp(-j\Omega 2l_c/v_g)]}{1 - \exp(-j\Omega 2l_c/v_g) + 2(F+\epsilon_f)G\gamma P_0/P_{sat}} \quad (2)$$

where $$G_k \equiv 2\beta_{0k}^i l_k = \frac{\Gamma g_0 l_k}{v_g} \frac{P_{sat}}{\gamma_k P_0 + P_{sat}} \left( \frac{\tau_n l_{0k}}{ev} - N_t \right) \quad (3)$$

in which $\gamma_k \equiv r_2/r_k [1+r_k^2 \exp(G_k)]$, and one must solve (3) numerically for $G_k$. Also, $$F_k \equiv \frac{1}{j\Omega \tau_n + \frac{\gamma_k P_0 + P_{sat}}{P_{sat}}} \quad (4)$$

and $H_k \equiv 1/(j\Omega \tau_{para,k}+1)$. For this simplified case, $G \equiv G_1 = G_2$, $F \equiv F_1 = F_2$ and $\gamma \equiv \gamma_1 = \gamma_2$. Note that the amount of loss in the center of cavity as shown in FIG. 1 does not need to be known since the amplifier gains and the mirror reflectivities are known, and the net average gain per roundtrip must be 1. FIG. 2 shows plots of Eq. (2) vs. modulation frequency Ω, using typical parameters for the MFL as given in Table 1.

One can see from the denominator of (2) and FIG. 2 that the power modulation response is somewhat periodic. The period is $\pi v_g/l_c$ with resonance peaks shifted a little to longer frequencies, the shift increasing with increasing average power $P_0$. $\epsilon_p$, the fast nonlinearity term, reduces the heights of the resonance peaks, a well-known effect in short-cavity lasers.

From the numerator of (2) and FIG. 2, one can see the interesting point that, despite the constraint that the amplifiers be identical, the response is different depending on whether $i_1$ or $i_2$ is modulated. Modulating $i_2$ causes the response to have large resonances with period $\pi v_g/l_c$ that dip all the way to zero. Modulating $i_1$, the furthest amplifier from the output, gives no extra resonances. This difference implies that the modulation response depends on where the response is measured and where the modulated amplifier(s) is located.

One way to explain the modulation response difference is that suppose a lightwave is injected externally into the cavity from the output port, and suppose that the amplifier modulation frequency is half of the cavity round-trip frequency. Upon the lightwave's return to the output, if the modulated amplifier is next to the output, the net modulation of the lightwave will be zero. However if the modulated amplifier is far from the output, the net modulation will differ from zero.

B. Detailed Model

Figure 3A:
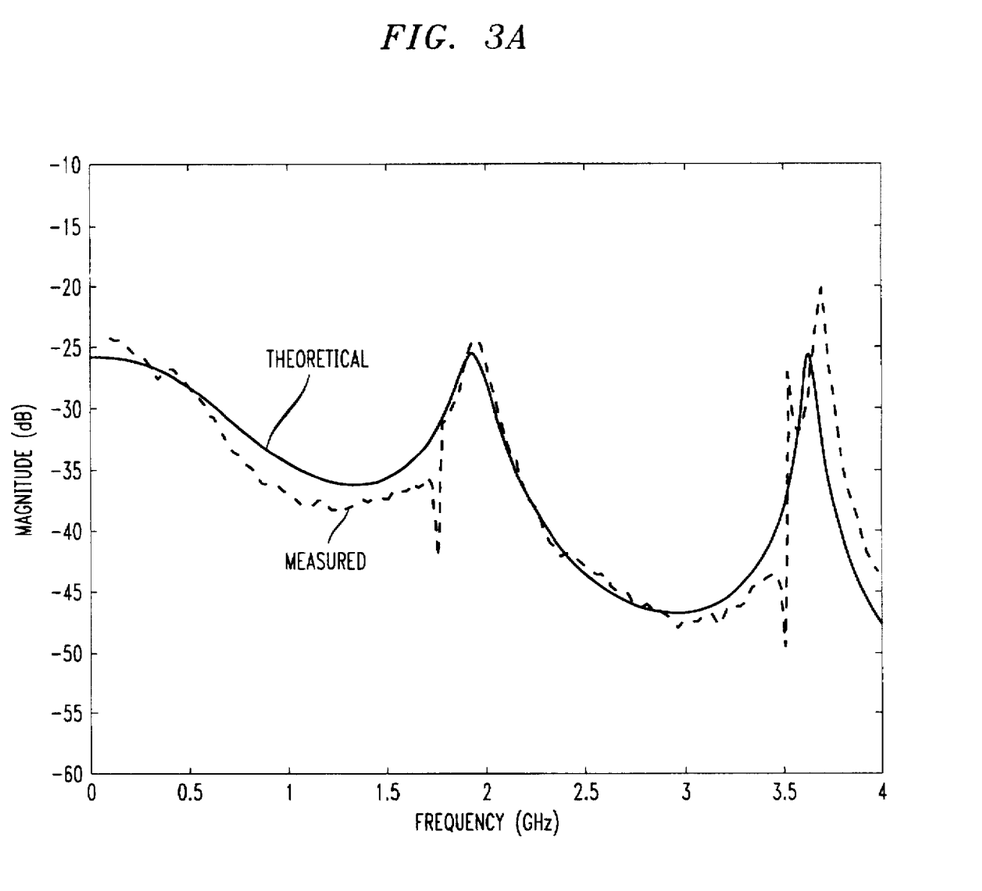
Figure 3B:
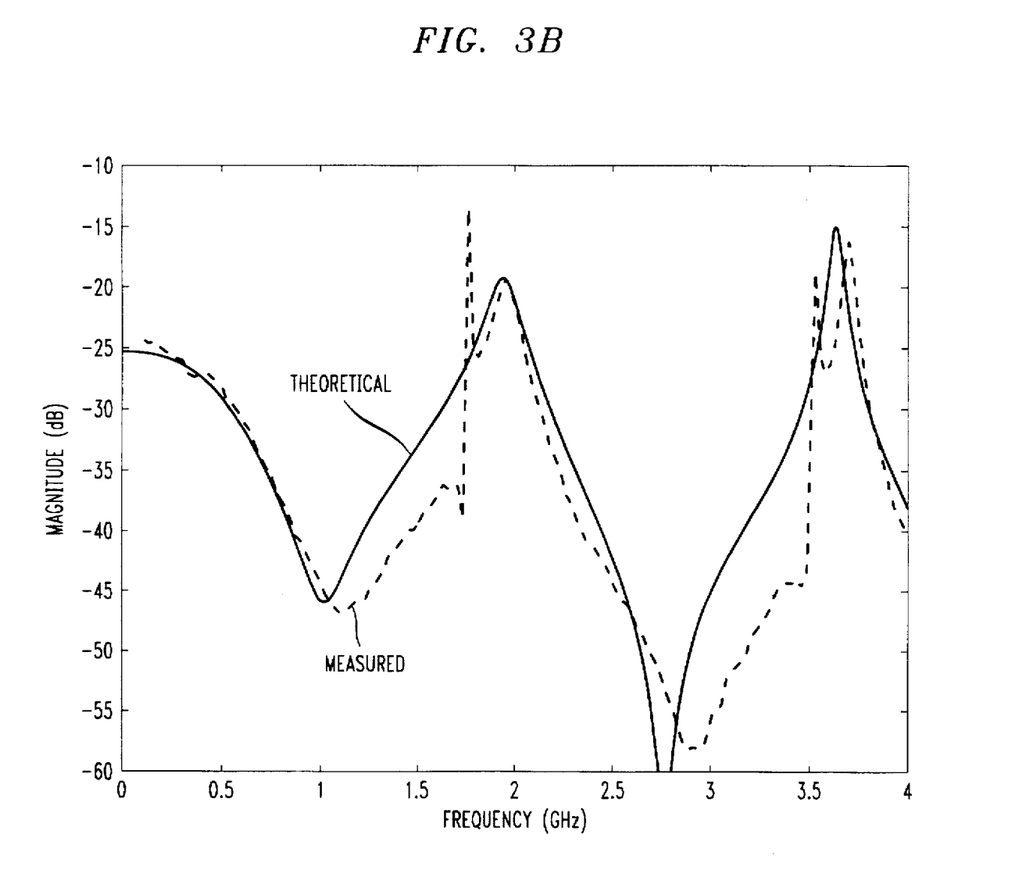

Shown as the solid lines in FIGS. 3a and b are plots of theoretical $|\Delta \tilde{p}_0/\Delta \tilde{i}_1|$ and $|\Delta \tilde{p}_0/\Delta \tilde{i}_2|$ vs. Ω, respectively, for a detailed model case with typical parameters of the 24-channel MFL as given in Table 1. The detailed model, is derived in my above-referenced article. As with the simpler case, the response is a series of resonance peaks that occur just after the cavity round-trip frequency and each harmonic. Also, as with the simpler case, the modulation of amplifier 2 of FIG. 1 gives approximately the same very low-frequency response and resonance peaks as amplifier 1 (the resonance peaks are higher only because of the amplifier 1 parasitics), but has much deeper dips. In fact, one can change the location of amplifier 1 by changing $d_1$ to verify that the largest response at high frequencies (i.e. the shallowest dip) is achieved by placing the modulated amplifier the furthest possible from the desired output. Actually, the amplifier 2 response is slightly higher at low frequencies before it dips well below the response of amplifier 1. Thus for low-frequency signals, modulating amplifier 2 is slightly the better choice; and for high-frequency signals, modulating amplifier 1 is significantly the better choice.

All of the parameters used in the theoretical plots were measured directly from the MFL, except for $g_0$, $\epsilon'_p$, $\tau_{para1}$, and $N_r$. These had to be determined by adjusting the theoretical response to fit the measured response, described next, except for $N_r$, which was taken directly from the above-identified Ref. [1]. Note that $\tau_n$ and $\tau_{para2}$ were measured by modulating amplifier 2 while amplifier 1 was off, so there was no laser oscillation, and fitting $|1/[(j\Omega\tau_n+1)(j\Omega\tau_{para2}+1)]|$ to the response, as shown by the solid line and dashed line in FIG. 4. The loss through the middle of the cavity (through the router) was calculated from the fitted parameters to be $-13.6$ dB.

C. Specific results

The dashed lines on FIG. 3 are the measured responses of $|\Delta\tilde{p}_0/\Delta\tilde{i}_1|$ and $|\Delta\tilde{p}_0/\Delta\tilde{i}_2|$ from one channel of the 24-channel MFL. The light was sent through a silica waveguide-grating router before being detected. The measured plots were normalized to meet the theoretical ones at $\Omega=0$, but they were not adjusted relative to each other. The theoretical and measured responses agree fairly well, except for a few main differences. One difference is the sharp discontinuities observed at the cavity resonance frequencies (round-trip frequencies) in the measured plots. At immediately lower frequencies than each cavity resonance frequency the response is decreased, while at immediately higher frequencies the response is increased. These discontinuities occur when the laser is in the active mode-locking regime in which there is strong coupling between spectral modes. It should be noted that the small-signal analysis breaks down in this regime. The widths of the discontinuities should be roughly equal to the laser linewidth. Also, there are some fast ripples in the measured plots that are most likely due to electrical reflections. Finally, note that only amplifier 1 was found to have noticeable parasitics below 4 GHz. This is most likely because the array amplifiers are connected to fanned-out microstrip lines, while the shared amplifier is connected directly to a coaxial cable.

D. Electronic precompensation

Figure 4:
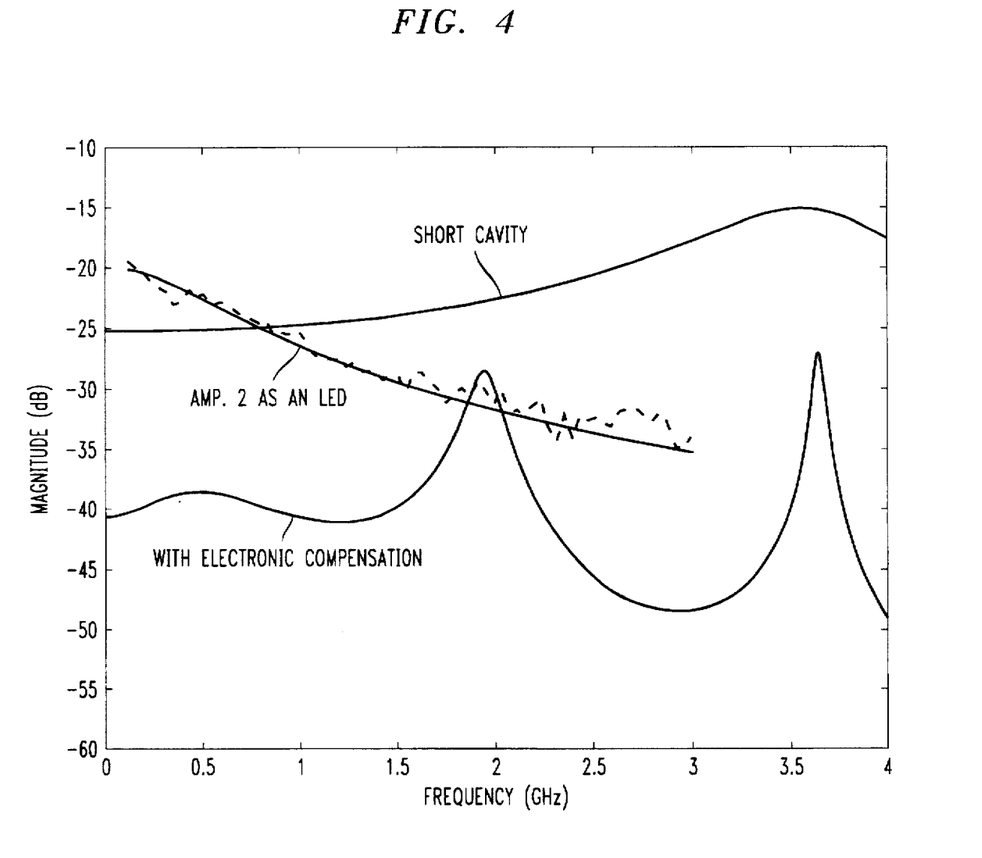
FIG. 4 shows the curve for a theoretical $|\Delta\tilde{p}_0/\Delta\tilde{i}_2|$ vs. $\Omega$ for a short-cavity laser ($I_c$ is set to be 30 times smaller with all other parameters unchanged). Another curve shows a theoretical (solid) and measured (dashed) $|\Delta\tilde{p}_0/\Delta\tilde{i}_2|$ vs. $\Omega$ when amplifier 1 is off [i.e., with amplifier 2 acting as a light-emitting diode (LED)]. The third curve shows a theoretical $|\Delta\tilde{p}_0/\Delta\tilde{i}_1|$ vs. $\Omega$ with the electronic compensation shown in FIG. 1.
Figure 5A:
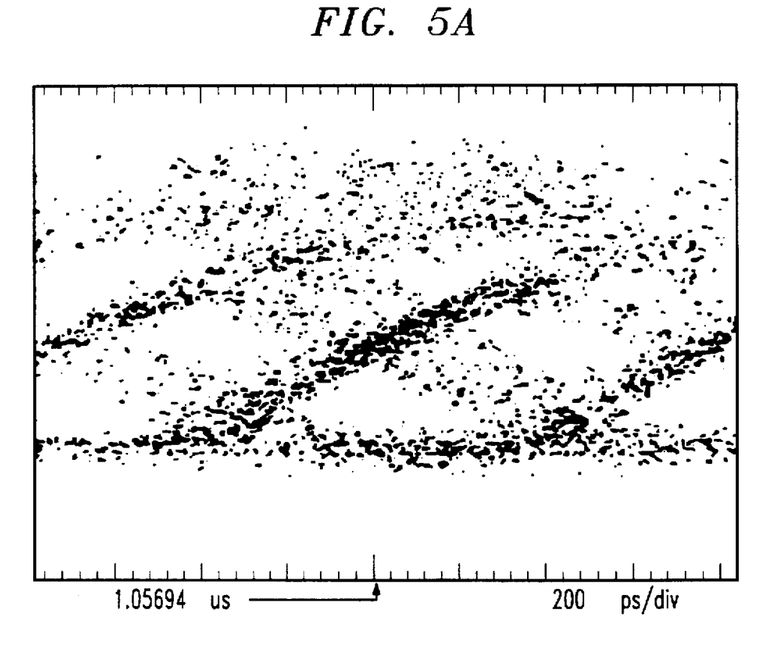
Figure 5B:
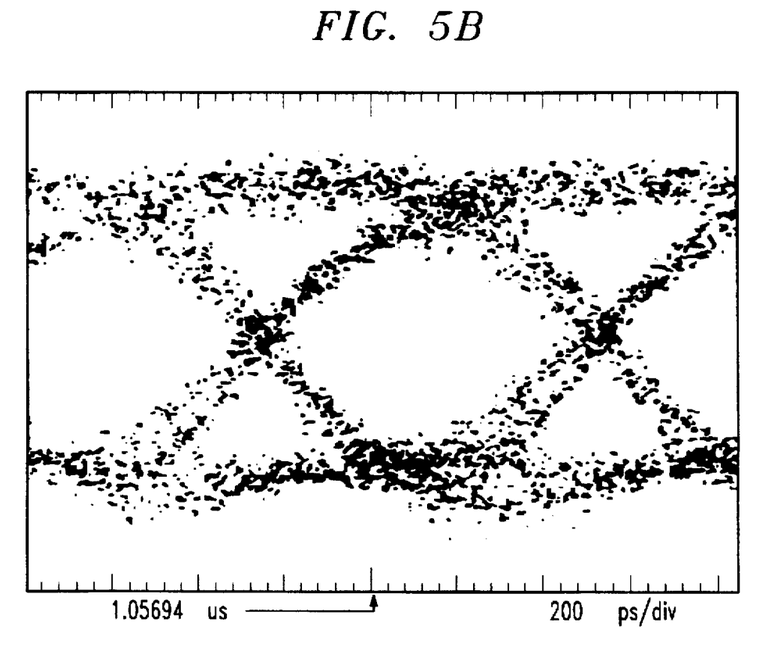
Figure 9:
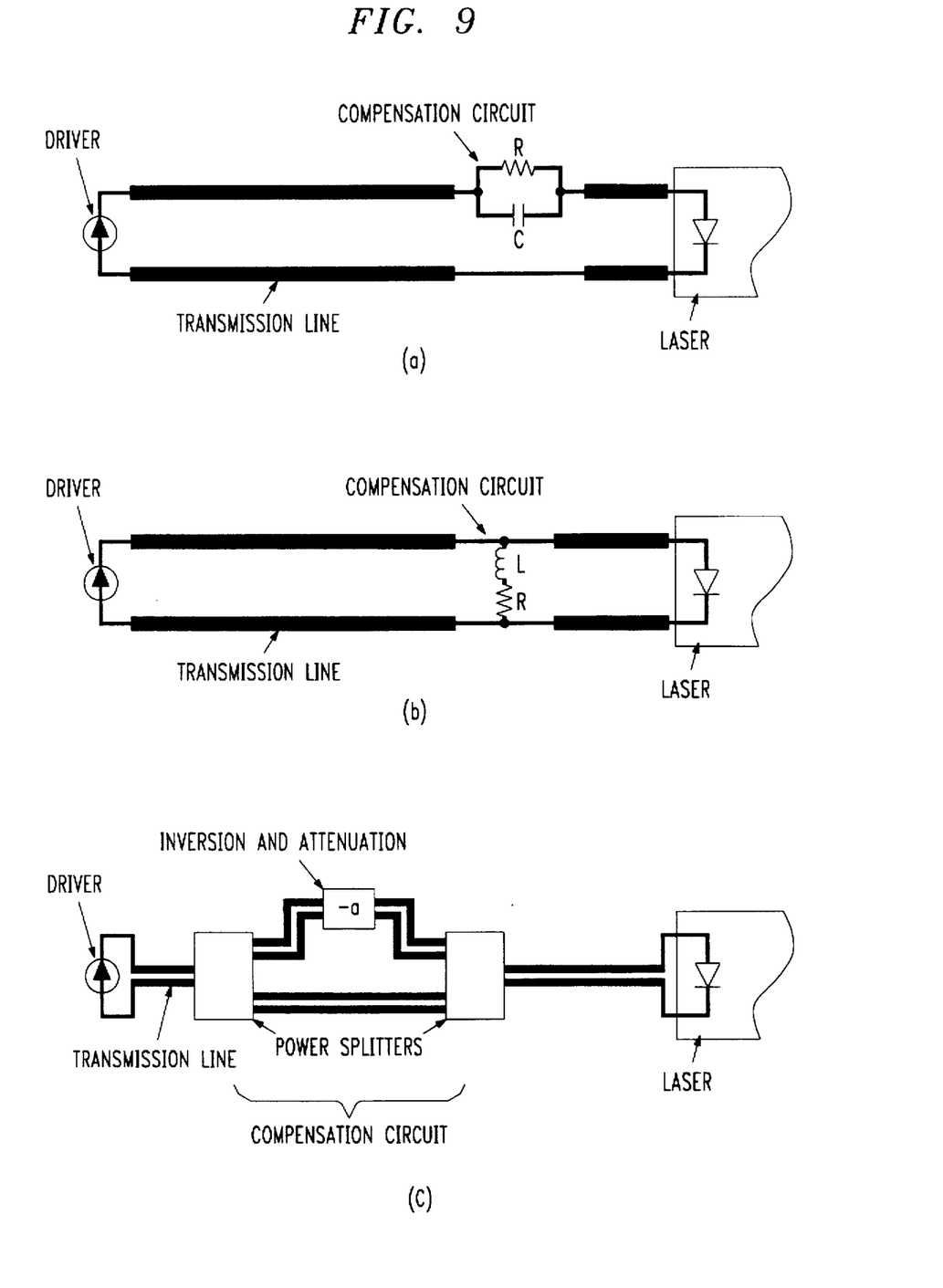
FIGS. 9a, 9b, and 9c show a variety of compensation circuits that may be used in the circuit of FIG. 1.

FIG. 5a shows the "eye diagram" resulting from modulating an array amplifier of the MFL with 1.24 Gb/s non-return-to-zero (NRZ) data. Because of the first dip in the modulation response, the eye is closed. However, modifying the electrical drive signal with a simple circuit that compensates for the first dip dramatically extends the modulation bandwidth. One such circuit is shown in FIG. 1. Its transfer function is $[j\Omega+1/(R_cC_c)]/[j\Omega+(R_r+R_c)/(R_rR_cC_c)]$, where $R_r$ is the impedance of the transmission line. The theoretical response of the laser with such a circuit before amplifier 1 is shown in FIG. 4 ($R_c=230\Omega$, $R_r=50\Omega$, $C_c=2$ pF). With reference to FIGS. 9a, 9b, and 9c there are shown a variety of compensation circuits. For comparison purposes, FIG. 9a shows another representation of the high pass compensation circuit used in FIG. 1, where the current source $I_1$ is the driver. FIG. 9b shows an implementation of a high pass compensation circuit. FIG. 9c shows another possible compensation circuit where the electrical input is split into two signals using a power splitter, the first signal is then inverted and attenuated (−a) and delayed (by an amount equal to the round-trip frquency of the cavity) relative to the second signal. The resulting first signal and the second signal are then recombined in a recombiner and sent to the laser. FIG. 5b shows the 1.24 Gb/s NRZ data eye using this second compensation circuit. Either compensation circuit results in nearly the same eye. Of course, some price for the compensation is paid in reduced on/off ratio. For example, the on/off ratio of the eye in FIG. 5b is about 2. Also, a large signal, such as NRZ, violates the small-signal approximation, and thus electronically removing the dip in the small-signal modulation response at a given operating condition does not necessarily imply that the large-signal modulation response is fully compensated.

E. Comparison to short-cavity lasers

For comparison, the upper solid line in FIG. 4 shows the equivalent theoretical short-cavity laser modulation response (all parameters are the same as the MFL except $I_c$ is set 30 times smaller). The response generally agrees with measurements from short-cavity lasers of Ref.[1]. As one can see, short-cavity lasers have a much larger uncompensated bandwidth than long-cavity lasers. It is interesting to note that short-cavity lasers have a resonance peak that occurs at a frequency much lower than the round-trip frequency, while long-cavity lasers have all the resonance peaks at frequencies higher than the round-trip frequency. This can be understood from Eq. (2). When the modulation frequency $\Omega << $ the round trip frequency $\pi v_g/I_c$ then the response is approximately proportional to $[(j\Omega 2I_c/v_g)(j\Omega\tau_n+1)+2G_rP_0/P_{sat}]^{-1}$. For a short-cavity laser under the above condition, $\Omega$ can be $>>1/\tau_n$, and the response has two complex poles, resulting in a resonance peak. For a long-cavity laser under the above condition, $\Omega$ cannot be $>>1/\tau_n$, and the response has only one pole.

Modulation of multiple channels

Figure 6:
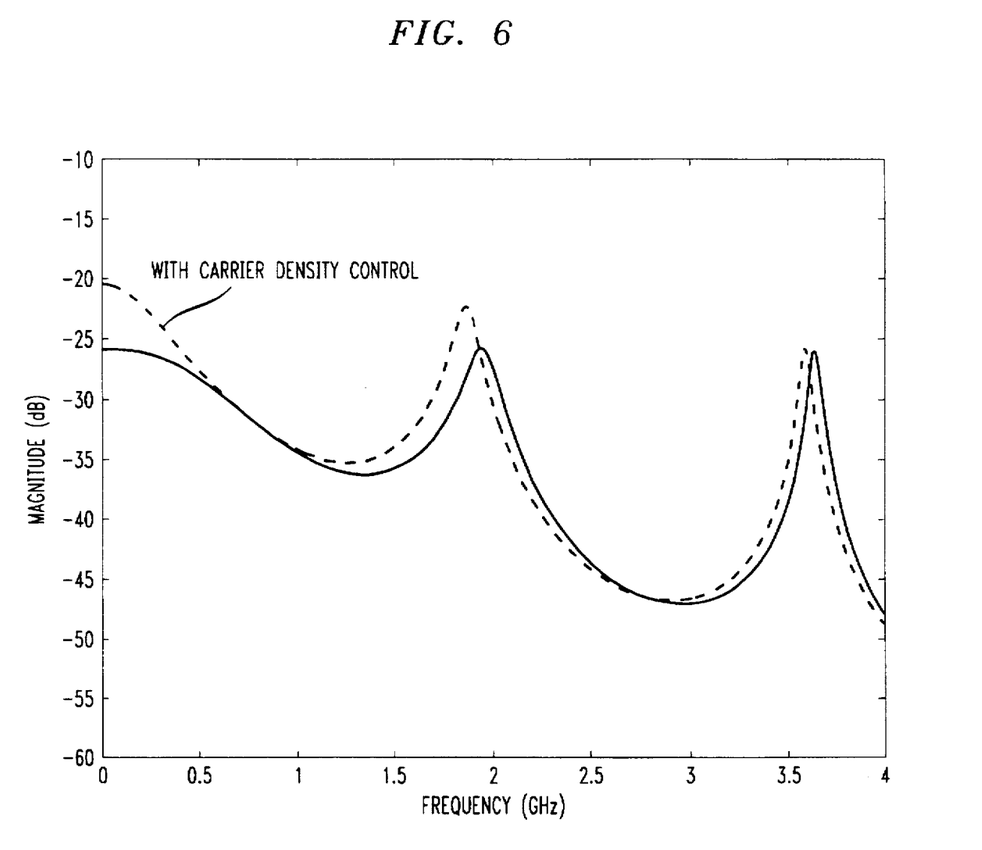
FIG. 6 shows the theoretical $|\Delta\tilde{p}_0/\Delta\tilde{i}_1|$ without (solid line) and with (dashed line) carrier density control in amplifier 2. To obtain the case of carrier density control, $F_2$ was set to zero.

The primary advantage of the direct modulation of a long-cavity laser such as the MFL is the ability to modulate several channels simultaneously with independent signals. If there is a shared semiconductor amplifier, then to minimize crosstalk and signal distortion, the carrier density n in the shared amplifier must be kept constant as described in the article by T. E. Darcie et al, "Electronic compensation of saturation-induced crosstalk in optical amplifier," Electron. Lett., vol. 24, pp. 1154–1155, 1988. However, keeping n constant in one of the amplifiers alters the modulation response, as shown in FIG. 6, which shows the responses from modulating amplifier 1 with and without carrier density control in amplifier 2. When carrier density control is employed, the response increases at low frequencies, but the bandwidth decreases. Thus if one uses electronic compensation to extend the bandwidth, the parameters of the compensation circuit must change from the case when there is no carrier density control.

Figure 7B:
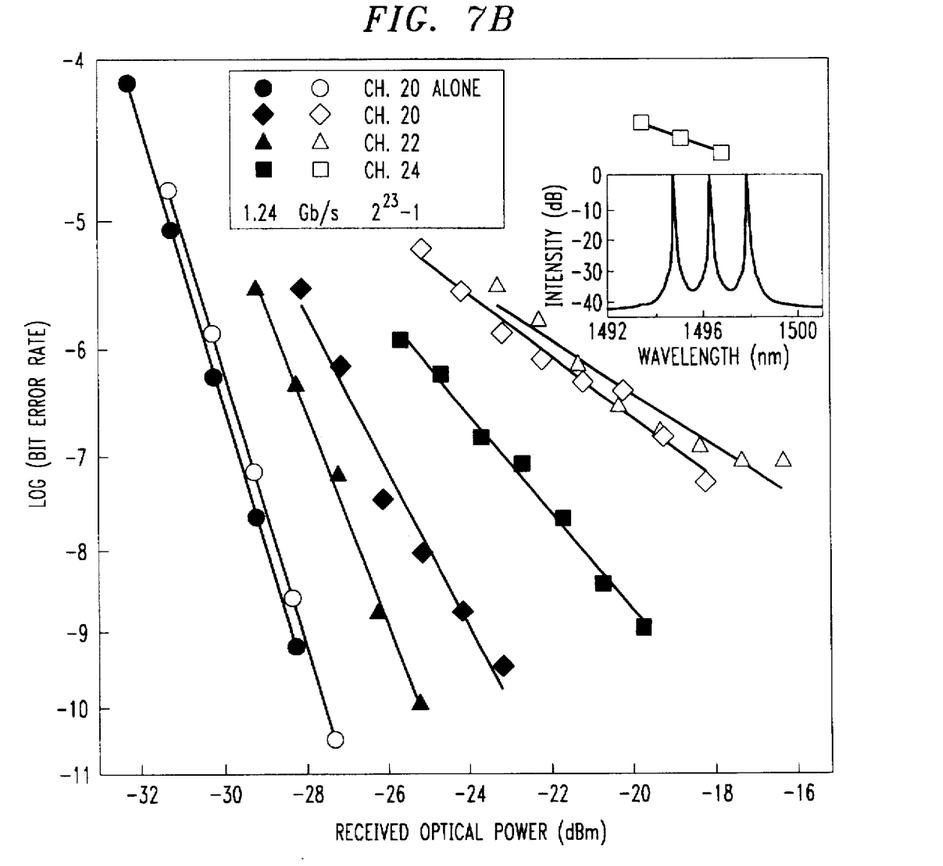

One way to keep n constant in the shared amplifier is to use a feed-forward apparatus with the inclusion of electronic compensation circuits 720 between the first power splitters 721 and the array optical amplifiers 722, as shown in FIG. 7a. Such an feed-forward arrangement is described in the recently allowed U.S. patent application Ser. No. 08/521, 100, now U.S. Pat. No. 5,576,8811, issued on Nov. 19, 1996 filed by C. H. Joyner, M. Zirngibl and myself, which is incorporated by reference herein. In that type of arrangement, and in accordance with the present invention, compensation circuits 720 precompensate the signals fed to the array amplifiers 722, while signals fed to the shared amplifier 710 are not precompensated and should represent the actual optical power reaching the shared amplifier 710. Using this scheme, FIG. 7b shows bit error rate curves for the case of three simultaneously modulated channels in the 24-channel MFL with independent 1.24 Gb/s $2^{23}-1$ pseudo-random patterns. The channels were demultiplexed with a silica router with 100 GHz channel spacing and were measured with an avalanche photodiode. The compensation circuit in FIG. 1 (shown as circuits 720 in FIG. 7a) was used for the electronic compensation with the same $RC_c=220$ $\Omega$ and $C_c=4.3$ pF for all the channels ($R_f=50$ W). As shown in FIG. 7b, while generally, a separate compensation circuit 720 is used for each array amplifier 722 (thereby enabling a different modulation signal for each channel) there may be applications where only one or more selected array amplifiers 722 include a compensation circuit 720. Additionally, in other applications, such as signal broadcasting, it may be desirable to modulate each channel with the same modulation signal, in which case perhaps only one precompensation circuit 720 may be shared by all of the array amplifiers 722.

As one can see from FIG. 7b, the feed-forward circuitry does make it possible for all three channels to be simultaneously error-free at 1.24 Gb/s (compare the solid and hollow symbol curves of FIG. 7b); however, there is still significant crosstalk as can be seen by the power penalties going from one channel alone to all three channels together. One improvement would be to replace the long cables currently used for the feed-forward circuit with a circuit board, reducing reflections and parasitics and replace the microstrip lines leading to the amplifiers with coplanar waveguides, reducing the crosstalk.

It should be noted that the MFL of the previously-referenced patent application had a much shorter cavity than the MFL used here (the cavity round-trip frequency was 2.5 GHz), which is why electronic compensation for the modulation response was not so necessary for the data rate of 622 Mb/s in that case.

7. Conclusions

To summarize, for direct modulation with a given signal bandwidth, the resulting optical signal from a long-cavity semiconductor laser is affected more by the cavity dynamics than a short-cavity semiconductor laser. The modulation response of a long-cavity laser depends on the location of the modulated amplifer in the cavity and the presence of other amplifiers. In general, the further the amplifier is from the output, the larger the response at high frequencies. The useful bandwidth can be significantly increased by the use of a simple electronic precompensation circuit. In a two-amplifier laser, keeping the carrier density constant in one of the amplifiers increases the response at low frequencies but reduces the uncompensated bandwidth. Short-cavity lasers have a resonance peak that occurs at a frequency lower than the round-trip frequency, while all of the resonance peaks in long-cavity lasers occur just after the round-trip frequency and each harmonic. Long-cavity lasers that use wave mixing to achieve single-mode operation must remain above threshold for very high-speed modulation.

What has been described is merely illustrative of the application of the principles of the present invention. Other arrangements and methods can be implemented by those skilled in the art without departing from the spirit and scope of the present invention.

I claim:

1. A modulated long-cavity optical laser for generating an optical laser signal, comprising an optical cavity containing one or more optical gain elements for which the round-trip frequency of a lightwave in the optical cavity is on the order of or lower than the inverse of the response time of the optical gain elements, a modulation port for receiving an electrical modulation signal for modulating an optical laser signal generated by the optical cavity, and electrical compensation means coupled to the modulation port of at least one of the one or more optical gain elements in the optical cavity for changing a frequency characteristic of the modulation signal so as to increase the modulation bandwidth of the modulated long-cavity laser.

2. The modulated long-cavity laser of claim 1 wherein the optical cavity is a ring cavity.

3. The modulated long-cavity laser of claim 1 wherein the optical cavity includes a first port and a second port connected through the optical cavity to a first port of an optical gain element which has an optical mirror at a second port thereof.

4. The modulated long-cavity laser of claim 1 wherein the electrical compensation means is connected in series between the received modulation signal and the modulation port.

5. The modulated long-cavity laser of claim 4 wherein the electrical compensation means changes the amplitude frequency response of the modulation signal.

6. The modulated long-cavity laser of claim 4 wherein the electrical compensation means changes the phase characteristics of the modulation signal.

7. The modulated long-cavity laser of claim 1 wherein the modulation port is part of the gain element furthest from where the optical laser signal is outputted from the modulated long-cavity laser.

8. The modulated long-cavity laser of claim 1 wherein the electrical compensation means is a high-pass circuit.

9. The modulated long-cavity laser of claim 1 wherein the electrical compensation means includes a resistor and a capacitor in series.

10. The modulated long-cavity laser of claim 1 wherein the electrical compensation means includes a splitter for splitting the modulation signal into first and second signals, the first signal being inverted, attenuated, and delayed by a predetermined amount and then combined with the second signal prior to being coupled to the modulation port.

11. The modulated long-cavity laser of claim 1 wherein increasing the optical cavity length increases the modulation bandwidth of the modulated long-cavity laser.

12. The modulated long-cavity laser of claim 1 being a Fabry-Perot laser.

13. A modulated long-cavity multifrequency optical laser comprising a plurality of input optical amplifiers each having an optical mirror at a first port and a second port connected through an optical combiner having a plurality of inputs and an output connected to a first port of an optical output amplifier which has a second optical mirror at a second port thereof, at least one of the input amplifiers also including a modulation port for receiving an electrical modulation signal for modulating the optical laser signal, the long-cavity multifrequency laser further comprising electrical compensation means coupled to the modulation port of at least one of the plurality of input amplifiers for changing a frequency characteristic of the modulation signal so as to increase the modulation bandwidth for the laser frequency associated with said at least one input amplifier.

14. The modulated long-cavity multifrequency laser of claim 13 further comprising a plurality of powersplitters, each connected to obtain a portion of an electrical modulation signal used to modulate a different one of the plurality of input amplifiers, a plurality of delay means, each connected to a first output of a different powersplitter, each delay means providing a different predetermined signal delay, wherein each electrical compensation means connects between a second output of a different powersplitter and one of the plurality of input amplifiers, and electrical signal combiner having a plurality of inputs, each input connected to a different output of the respective delay means, for combining a portion of the modulation signal received from the connected delay means to form a combined electrical signal at an output of the electrical signal combiner, the output of the electrical signal combiner providing a biasing signal to the optical output amplifier.

15. The modulated long-cavity multifrequency laser of claim 13 wherein one electrical compensation means is connected to be shared among all of the input amplifiers.

16. The modulated long-cavity multifrequency laser of claim 13 wherein the optical combiner is a waveguide grating router.

17. The modulated long-cavity multifrequency laser of claim 13 being implemented as a Fabry-Perot laser.

* * * * *